United States Patent
Zhai et al.

(10) Patent No.: US 12,345,761 B2
(45) Date of Patent: Jul. 1, 2025

(54) RADIO FREQUENCY CONDUCTION TEST METHOD AND RELATED APPARATUS WITHOUT A RADIO FREQUENCY SWITCH TEST SOCKET

(71) Applicant: HONOR DEVICE CO., LTD., Shenzhen (CN)

(72) Inventors: Wei Zhai, Shenzhen (CN); Cheng Jiang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 105 days.

(21) Appl. No.: 18/012,158

(22) PCT Filed: Oct. 29, 2021

(86) PCT No.: PCT/CN2021/127365
§ 371 (c)(1),
(2) Date: Dec. 21, 2022

(87) PCT Pub. No.: WO2022/179155
PCT Pub. Date: Sep. 1, 2022

(65) Prior Publication Data
US 2024/0036109 A1 Feb. 1, 2024

(30) Foreign Application Priority Data
Feb. 26, 2021 (CN) .......................... 202110215061.X

(51) Int. Cl.
*G01R 31/309* (2006.01)
(52) U.S. Cl.
CPC .................................. *G01R 31/309* (2013.01)

(58) Field of Classification Search
CPC ............ G01R 31/2815; G01R 31/2822; G01R 31/309; G01R 1/0416; G01R 31/00; H04B 17/0085; H04B 17/103; H04B 17/27
See application file for complete search history.

(56) References Cited

U.S. PATENT DOCUMENTS

| 7,555,276 B2 | 6/2009 | Wilcox |
| 8,063,719 B2 | 11/2011 | Lo Hine Tong et al. |

(Continued)

FOREIGN PATENT DOCUMENTS

| CN | 101034947 A | 9/2007 |
| CN | 101232695 A | 7/2008 |

(Continued)

*Primary Examiner* — Paresh Patel
(74) *Attorney, Agent, or Firm* — WOMBLE BOND DICKINSON (US) LLP

(57) ABSTRACT

A radio frequency conduction test method and a test system are provided. The test method includes: moving a radio frequency test probe to a first pad of a board so as to allow a test signal on the first pad to be transmitted to the radio frequency test probe and then transmitted to a radio frequency test instrument for a radio frequency conduction test, where the test signal in the radio frequency test probe is transmitted to the radio frequency test instrument via an impedance conversion apparatus and a directional coupler, a straight-through output port of the directional coupler is connected to a first measurement port of the radio frequency test instrument, and a coupling output port of the directional coupler is connected to a second measurement port of the radio frequency test instrument.

11 Claims, 7 Drawing Sheets

(56) References Cited

U.S. PATENT DOCUMENTS

| | | | |
|---|---|---|---|
| 8,538,350 B2* | 9/2013 | Varjonen | H04B 17/102 |
| | | | 455/115.2 |
| 10,110,336 B2 | 10/2018 | Kucheravy | |
| 10,520,535 B1* | 12/2019 | Lau | G01R 1/06772 |
| 2010/0123473 A1 | 5/2010 | Kim | |
| 2013/0154887 A1 | 6/2013 | Hein et al. | |

FOREIGN PATENT DOCUMENTS

| | | | | |
|---|---|---|---|---|
| CN | 101331685 A | | 12/2008 | |
| CN | 201839519 U | | 5/2011 | |
| CN | 103281144 A | | 9/2013 | |
| CN | 105100308 A | | 11/2015 | |
| CN | 204882808 U | | 12/2015 | |
| CN | 205941717 U | | 2/2017 | |
| CN | 207352122 U | | 5/2018 | |
| CN | 108471468 A | | 8/2018 | |
| CN | 109103711 A | * | 12/2018 | G01R 1/0408 |
| CN | 209170386 U | | 7/2019 | |
| CN | 111510170 A | | 8/2020 | |
| CN | 112595920 A | | 4/2021 | |
| EP | 1995998 B1 | | 3/2010 | |
| EP | 2348324 B1 | | 9/2012 | |
| WO | 2019061389 A1 | | 4/2019 | |

\* cited by examiner

RADIO FREQUENCY CONDUCTION TEST METHOD AND RELATED APPARATUS WITHOUT A RADIO FREQUENCY SWITCH TEST SOCKET

CROSS-REFERENCE TO RELATED APPLICATIONS

This application is a National Stage of International Application No. PCT/CN2021/127365, filed Oct. 29, 2021, which claims priority to Chinese Patent Application No. 202110215061.X, filed on Feb. 26, 2021, both of which are incorporated herein by references in their entireties.

TECHNICAL FIELD

This application relates to the radio frequency conduction test technology, and in particular, to a radio frequency conduction test method and a related apparatus.

BACKGROUND

It is well known that a process of producing wireless terminal products is not simple, and various tests need to be performed on wireless terminal products to ensure that these wireless terminal products are fully functional. For example, a process of producing mobile phones includes board surface mounting (Surface Mount Technology, SMT), board functional test (Functional Test, FT), assembly, pre-processing (Assembly), man-machine interface (Man-Machine Interface, MMI) test, and the like. During processing of boards of wireless terminal products, generally a conduction test on radio frequency indicators of boards needs to be performed.

In the prior art, a radio frequency conduction test is typically performed using a radio frequency test probe and a radio frequency switch test socket. However, the radio frequency switch test socket is generally of no other use after completion of the test. Radio frequency switch test sockets, when provided in a large quantity on a board, not only occupy layout area of the board but also increase device costs of a product.

SUMMARY

Embodiments of the present invention disclose a radio frequency conduction test method and a related apparatus that can use an existing device pad on a board to perform a radio frequency conduction test and can weld a to-be-welded serial device to this device pad after completion of the test without needing to use a radio frequency switch test socket any more, thereby saving layout area of the board and reducing device costs.

According to a first aspect, this application provides a radio frequency conduction test method. The method includes: moving a radio frequency test probe to a first pad of a board so as to allow a test signal on the first pad to be transmitted to the radio frequency test probe for testing, where the board includes a radio frequency front-end circuit, a radio frequency back-end circuit, the first pad, a second pad, and a to-be-welded serial device; the to-be-welded serial device is a device to be welded to the first pad and the second pad; and the first pad is connected to the radio frequency front-end circuit, the second pad is connected to the radio frequency back-end circuit, and the radio frequency front-end circuit and the radio frequency back-end circuit are in an off state; and after completion of the test, moving away the radio frequency test probe and welding the serial device to the first pad and the second pad so as to enable the radio frequency front-end circuit and the radio frequency back-end circuit to be in an on state.

In the technical solution provided in this application, before the radio frequency conduction test, a specific serial device in a radio frequency circuit is not welded, during the radio frequency conduction test, a test signal on a first pad for this serial device is transmitted to the radio frequency test probe (the test signal is not transmitted to a second pad for the serial device) and then transmitted to a radio frequency test instrument for testing, and after completion of the radio frequency conduction test, the serial device is welded to the first pad and the second pad. Because the serial device, the first pad, and the second pad themselves are the component and pads required by the radio frequency circuit to perform the radio frequency function, a new device for performing the radio frequency conduction test does not need to be added in this embodiment of this application, for example, a device such as a point for testing, a pad, or a zero-ohm resistor, that is specially used for testing. In this way, device costs are reduced, and layout of the point for testing, pad, or zero-ohm resistor that is used for testing does not need to be considered, also saving layout area of the board.

With reference to the first aspect, in a possible implementation of the first aspect, after the moving a radio frequency test probe to a first pad of a board, the test signal in the radio frequency test probe is transmitted to a radio frequency test instrument via an impedance conversion apparatus. In the technical solution provided in this application, the impedance conversion apparatus may be added so as to implement conversion of contact impedance into characteristic impedance between the radio frequency test probe and the first pad, thereby improving accuracy of the radio frequency conduction test.

With reference to the first aspect, in a possible implementation of the first aspect, after the moving a radio frequency test probe to a first pad of a board, the test signal in the radio frequency test probe is transmitted to a radio frequency test instrument via the impedance conversion apparatus and a directional coupler.

In the technical solution provided in this application, the apparatus directional coupler may be added in addition to the impedance conversion apparatus, so as to implement reflection power monitoring and transmission power compensation, thereby improving accuracy of the radio frequency conduction test.

With reference to the first aspect, in a possible implementation of the first aspect, a straight-through output port of the directional coupler is connected to a first measurement port of the radio frequency test instrument, and a coupling output port of the directional coupler is connected to a second measurement port of the radio frequency test instrument.

In the technical solution provided in this application, most test signals are output from the straight-through output port, a small amount of test signals are output from the coupling output port, and hardly any signals are output from an isolation port. Output power of an impedance path can be measured through the straight-through output port, and reflection power can be measured through the coupling output port, so as to implement transmission power compensation, thereby improving accuracy of the radio frequency conduction test.

With reference to the first aspect, in a possible implementation of the first aspect, the radio frequency test probe and/or the first pad is treated with nickel and gold plating.

In the technical solution provided in this application, the radio frequency test probe and/or the first pad may be treated with nickel and gold plating, so that the radio frequency test probe can have good contact with the first pad during the radio frequency conduction test, thereby improving accuracy of the radio frequency conduction test.

With reference to the first aspect, in a possible implementation of the first aspect, after the moving a radio frequency test probe to a first pad of a board, the method further includes: enabling a first portion of the radio frequency test probe to be in contact with a second portion of the first pad, where the first portion and/or the second portion is treated with nickel and gold plating.

In the technical solution provided in this application, the contact portion of the radio frequency test probe and the contact portion of the first pad during the radio frequency conduction test are treated with nickel and gold plating, so that the test signal can be better transmitted from the radio frequency test probe to the first pad, thereby improving accuracy of the radio frequency conduction test.

With reference to the first aspect, in a possible implementation of the first aspect, the welding the serial device to the first pad and the second pad includes: welding the serial device to the first pad and the second pad through low-temperature reflow soldering or laser welding.

In the technical solution provided in this application, the serial device is welded to the board through welding such as low-temperature reflow soldering or laser welding to obtain the board that has been subjected to the radio frequency conduction test, and this board has no other useless device, thereby saving layout area of the board.

With reference to the first aspect, in a possible implementation of the first aspect, a center-to-center distance between the first pad and the second pad is not less than 0.254 millimeter and not greater than 2.54 millimeters.

In the technical solution provided in this application, reasonable setting of the center-to-center distance between the first pad and the second pad can avoid unintended contact of the radio frequency test probe and the second pad during the radio frequency conduction test.

According to a second aspect, this application provides a radio frequency conduction test system. The system includes a board, a radio frequency test probe, and a radio frequency test instrument, where the board includes a radio frequency circuit, a first pad, and a second pad, where the radio frequency circuit includes a radio frequency front-end circuit and a radio frequency back-end circuit, the first pad is connected to the radio frequency front-end circuit, the second pad is connected to the radio frequency back-end circuit, the radio frequency front-end circuit and the radio frequency back-end circuit are in an off state, and the first pad and the second pad are pads for a serial device to be welded into the radio frequency circuit; the radio frequency test probe is configured to transmit a test signal on the first pad to the radio frequency test instrument; and the radio frequency test instrument is configured to test the test signal.

With reference to the second aspect, in a possible implementation of the second aspect, the system further includes an impedance conversion apparatus that is connected to the radio frequency test probe and to the directional coupler, where the impedance conversion apparatus is configured to transmit the test signal in the radio frequency test probe to the radio frequency test instrument.

With reference to the second aspect, in a possible implementation of the second aspect, the system further includes an impedance conversion apparatus and a directional coupler, where the impedance conversion apparatus is connected to the radio frequency test probe and the directional coupler, the directional coupler is further connected to the radio frequency test instrument, the impedance conversion apparatus is configured to transmit the test signal in the radio frequency test probe to the directional coupler, and the directional coupler is configured to transmit the test signal to the radio frequency test instrument.

With reference to the second aspect, in a possible implementation of the second aspect, a straight-through output port of the directional coupler is connected to a first measurement port of the radio frequency test instrument, and a coupling output port of the directional coupler is connected to a second measurement port of the radio frequency test instrument.

With reference to the second aspect, in a possible implementation of the second aspect, the radio frequency test probe and/or the first pad is treated with nickel and gold plating.

With reference to the second aspect, in a possible implementation of the second aspect, a center-to-center distance between the first pad and the second pad is not less than 0.254 millimeter and not greater than 2.54 millimeters.

According to a third aspect, this application provides a radio frequency conduction test apparatus, where the apparatus is applied to a radio frequency conduction test, and the apparatus includes a radio frequency circuit, a first pad, and a second pad, where the radio frequency circuit includes a radio frequency front-end circuit and a radio frequency back-end circuit, the first pad is connected to the radio frequency front-end circuit, the second pad is connected to the radio frequency back-end circuit, and the radio frequency front-end circuit and the radio frequency back-end circuit are in an off state; and the first pad and the second pad are pads for a serial device to be welded into the radio frequency circuit.

With reference to the third aspect, in a possible implementation of the third aspect, the first pad is treated with nickel and gold plating.

With reference to the third aspect, in a possible implementation of the third aspect, a center-to-center distance between the first pad and the second pad is not less than 0.254 millimeter and not greater than 2.54 millimeters.

It can be understood that both the radio frequency conduction test system provided in the second aspect and the radio frequency conduction test apparatus provided in the third aspect are used to perform the radio frequency conduction test method provided in the first aspect. Therefore, for beneficial effects that can be achieved by the radio frequency conduction test system and the radio frequency conduction test apparatus, reference may be made to the beneficial effects of the radio frequency conduction test method provided in the first aspect, and details are not described herein again.

DETAILED DESCRIPTION OF EMBODIMENTS

Figure 1:
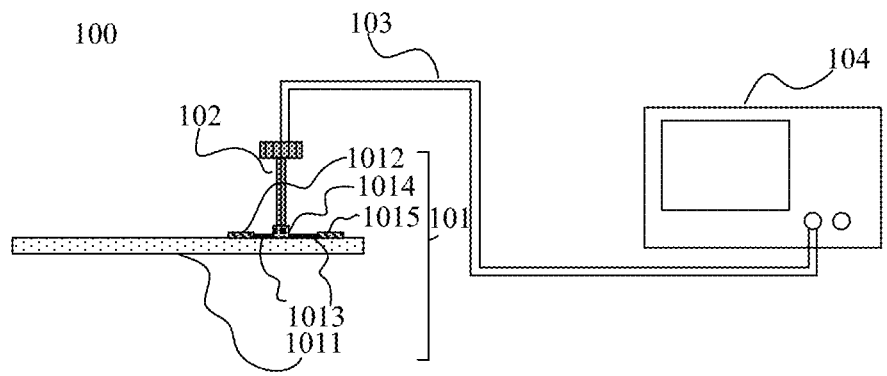
FIG. 1 is a schematic structural diagram of a radio frequency conduction test system according to an embodiment of this application.

The following clearly and describes the technical solutions in the embodiments of this application with reference to the accompanying drawings. Apparently, the described embodiments are merely some but not all of the embodiments of this application. All other embodiments obtained by a person of ordinary skill in the art based on the embodiments of this application and without creative efforts shall fall within the protection scope of this application.

For ease of understanding by persons skilled in the art, some terms and the related art used in this application are described first.

Characteristic impedance, also referred to as "natural impedance", is not direct current resistance and is a concept in long wire transmission. In a high frequency range, during signal transmission, a transient current is generated due to establishment of an electric field between a signal line and a reference plane (power source or horizontal plane) along a place at which the signal arrives. If the transmission line is isotropic, there is always a current I as long as the signal is being transmitted, and if an output level of the signal is V, during the signal transmission, the transmission line will be equivalent to a resistor with a magnitude of V/I. This equivalent resistance is referred to as characteristic impedance Z of the transmission line. During signal transmission, when characteristic impedance on the transmission path changes, the signal is reflected at a node with discontinuous impedance. There are two kinds of characteristic impedance in radio frequency devices in wireless communication systems, one being 50Ω and used in systems such as military microwave, GSM, and WCDMA, and the other being 75Ω and used in cable television systems, which is less commonly used.

Reflow soldering technology is a soldering technology used in the manufacturing field, and elements on boards of many electronic devices can be soldered to circuit boards by using this process. There are low temperature solder paste and high temperature solder paste in the reflow soldering process. Literally, "high temperature" and "low temperature" refer to a difference in melting point between these two types of solder paste. Generally speaking, a conventional melting point in reflow soldering is above 217° C., but a melting point of conventional low temperature solder paste is 138° C. The high temperature solder paste is suitable for high temperature soldering of elements and PCBs; and the low temperature solder paste is suitable for those elements or PCBs that cannot withstand high temperature soldering, for example, soldering of radiator module, soldering of LEDs, and high-frequency soldering. The low temperature solder paste is used in a low-temperature reflow soldering technology, and the high temperature solder paste is used in a high-temperature reflow soldering technology.

Microstrip line is a microwave transmission line formed by a single conductor belt supported by a dielectric substrate and is suitable for making transmission line in plane structure of a microwave integrated circuit. Compared with metallic waveguide, the microstrip line has small size, light weight, wide frequency band use, high reliability, low manufacturing costs, and the like, but has slightly larger loss and small power capacity.

Directional coupler is a universal microwave/millimeter wave component and can be used for isolation, separation, and mixing of signals, for example, power monitoring, amplitude stabilizing of source output power, signal source isolation, and sweep test on transmission and reflection. Main technical indicators of a directional coupler are directivity, standing wave ratio, coupling degree, and insertion loss.

According to the foregoing description, during processing of boards of wireless terminal products, generally a conduction test on radio frequency indicators of boards needs to be performed to ensure that the wireless terminal products produced are fully functional, for example, ensuring that the wireless terminal products can be smoothly connected to a network. It can be understood that the wireless terminal products include but are not limited to mobile phones, tablet computers, speaker boxes, smart watches, and other terminals.

As shown in FIG. 1 which is a schematic structural diagram of a radio frequency conduction test system according to an embodiment of this application, a radio frequency conduction test is performed using a radio frequency test switch socket. The radio frequency conduction test system 100 shown in FIG. 1 includes a board 101, a radio frequency test probe 102, a radio frequency cable 103, and a radio frequency test instrument 104, where the board 101 includes a panel 1011, a radio frequency front-end circuit 1012, a signal transmission line 1013, a radio frequency switch test socket 1014, and a radio frequency back-end circuit 1015. It can be understood that the radio frequency front-end circuit 1012, the signal transmission line 1013, the radio frequency switch test socket 1014, and the radio frequency back-end circuit 1015 are all welded to the panel 1011, the radio frequency front-end circuit 1012 is connected to the radio frequency switch test socket 1014 via the signal transmission line 1013, and the radio frequency switch test socket 1014 is connected to the radio frequency back-end circuit 1015 also via the signal transmission line 1013. During the radio frequency conduction test, the radio frequency test probe 102 is connected to the radio frequency test instrument 104 via the radio frequency cable 103.

It should be noted that the panel 1011 is a circuit board without any circuit device or chip welded, the board 101 may be a circuit board with a component and/or chip welded, such circuit board includes but is not limited to a ceramic circuit board, an alumina ceramic circuit board, an aluminum nitride ceramic circuit board, a line board, a printed circuit board (Printed Circuit Board, PCB), an aluminum substrate, a high-frequency board, a thick copper board, an impedance board, an ultra-thin line board, an ultra-thin circuit board, and a printed (using copper etching technology) circuit board, and the signal transmission line 1013 includes but is not limited to a microstrip line.

It can be understood that, in addition to the panel 1011, the radio frequency front-end circuit 1012, the signal transmission line 1013, the radio frequency switch test socket 1014, and the radio frequency back-end circuit 1015, the board 101 may include other components and signal transmission lines, where the signal transmission line includes but is not limited to a microstrip line.

It should also be noted that the radio frequency front-end circuit 1012 refers to a partial circuit between an antenna and an intermediate frequency (or a baseband) circuit, and signals are transmitted in the form of radio frequency in this section of circuit. For a wireless receiver, a radio frequency front-end typically includes an amplifier, a filter, a converter, and some radio frequency connecting and matching circuits. The radio frequency back-end circuit 1015 includes but is not limited to an antenna matching circuit.

Figure 2:
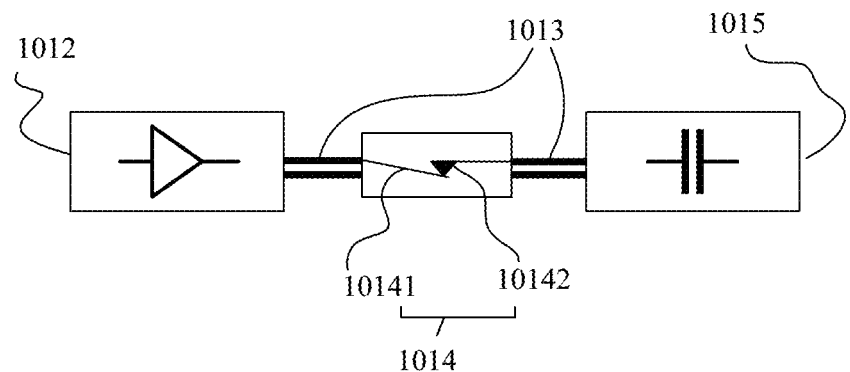
FIG. 2 is a schematic principle diagram of a radio frequency conduction test system according to an embodiment of this application.

Further, as shown in FIG. 2 that is a schematic principle diagram of a radio frequency conduction test system according to an embodiment of this application, the radio frequency switch test socket 1014 includes two connecting elastic pieces: a first connecting elastic piece 10141 and a second connecting elastic piece 10142, where the first connecting elastic piece 10141 is connected to the radio frequency front-end circuit 1012 via the signal transmission line 1013, and the second connecting elastic piece 1042 is connected to the radio frequency back-end circuit 1015 via the signal transmission line 1013. When not subjected to an external force, the first connecting elastic piece 10141 and the second connecting elastic piece 10142 are in contact with each other. In this case, a test signal can be transmitted from the radio frequency front-end circuit to the first connecting elastic piece 10141 and then transmitted to the radio frequency back-end circuit 1015 via the second connecting elastic piece 10142, ensuring normal working of the circuits on the board 101.

Figure 3:
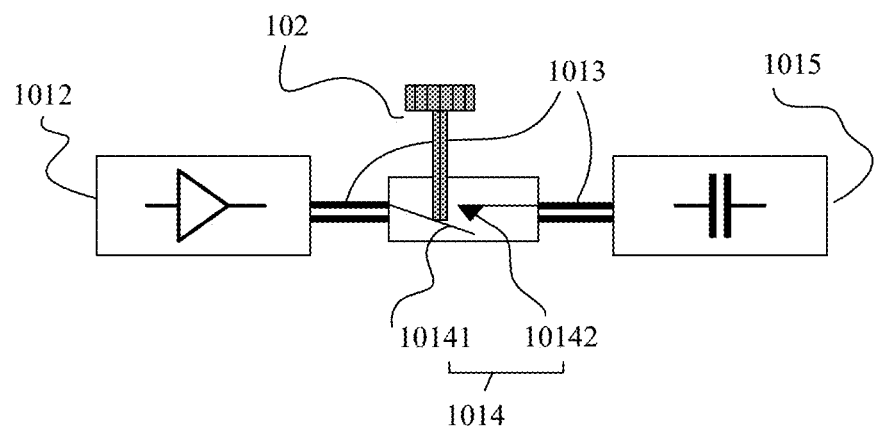
FIG. 3 is a schematic principle diagram of another radio frequency conduction test system according to an embodiment of this application.

During the radio frequency conduction test, as shown in FIG. 3 that is a schematic principle diagram of another radio frequency conduction test system according to an embodiment of this application, the radio frequency test probe 102 is pressed down to contact the connecting elastic piece 1041 and separate the connecting elastic piece 1041 from the connecting elastic piece 1042. In this case, the first connecting elastic piece 10141 and the second connecting elastic piece 10142 are not in contact, and the test signal cannot be transmitted from the radio frequency front-end circuit 1011 to the second connecting elastic piece 10142 via the first connecting elastic piece 10141, but is transmitted from the radio frequency front-end circuit 1012 to the radio frequency test probe 102 via the first connecting elastic piece 10141. As shown in FIG. 1, the test signal is transmitted to the radio frequency test probe 102 and then finally transmitted to the radio frequency test instrument 104 through the radio frequency cable 103, and the radio frequency test instrument 104 completes the radio frequency conduction test. After completion of the radio frequency conduction test, the radio frequency switch test socket 1014 is restored to the state shown in FIG. 2.

However, a radio frequency switch test socket is mainly used for a radio frequency conduction test during production and processing of boards, and the radio frequency switch test socket is generally of no other use after completion of the radio frequency conduction test. A relatively large number of radio frequency switch test sockets provided on a board not only occupy layout area of the board, but also increase device costs of a product.

Based on the foregoing content, embodiments of this application provide a radio frequency conduction test method and a related apparatus that can use a device pad to perform a radio frequency conduction test, without needing to add a radio frequency switch test socket, thereby saving layout area of the board and reducing device costs.

The following describes a system used in an embodiment of this application first. This embodiment of this application provides a radio frequency conduction test system. The system includes a board, a radio frequency test probe, and a radio frequency test instrument, where the board includes a radio frequency circuit, a first pad, and a second pad, where the radio frequency circuit includes a radio frequency front-end circuit and a radio frequency back-end circuit, the first pad is connected to the radio frequency front-end circuit, the second pad is connected to the radio frequency back-end circuit, the radio frequency front-end circuit and the radio frequency back-end circuit are in an off state, and the first pad and the second pad are pads for a serial device to be welded into the radio frequency circuit; the radio frequency test probe is configured to transmit a test signal on the first pad to the radio frequency test instrument; and the radio frequency test instrument is configured to test the test signal.

Figure 4:
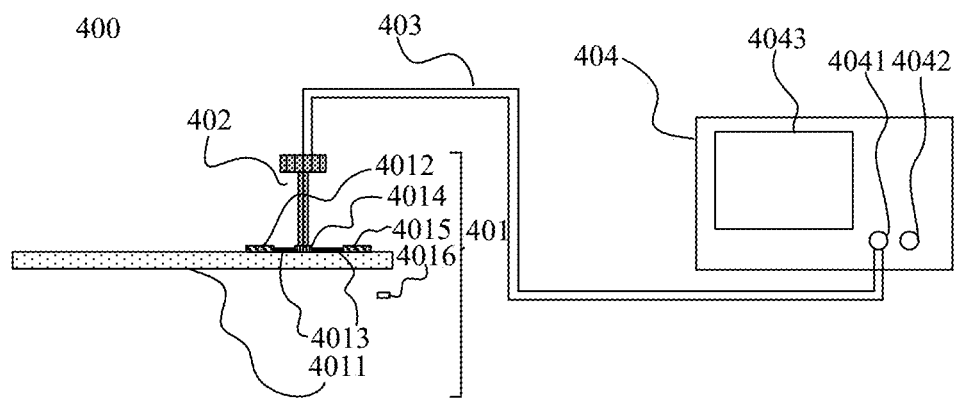
FIG. 4 is a schematic structural diagram of another radio frequency conduction test system according to an embodiment of this application.

For example, FIG. 4 is a schematic structural diagram of another radio frequency conduction test system according to an embodiment of this application. The radio frequency conduction test system 400 shown in FIG. 4 includes a board 401, a radio frequency test probe 402, a radio frequency cable 403, and a radio frequency test instrument 404, where the board 401 includes a panel 4011, a radio frequency front-end circuit 4012, a signal transmission line 4013, a device pad 4014, a radio frequency back-end circuit 4015, and a to-be-welded serial device 4016. It can be understood that the radio frequency front-end circuit 4012, the signal transmission line 4013, the device pad 4014, and the radio frequency back-end circuit 4015 are all welded to the panel 4011, and the to-be-welded serial device 4016 is to be welded to the device pad 4014, that is, the to-be-welded serial device 4016 currently is not welded to the panel 4011 and has no connection relationship with other devices on the panel 4011. The radio frequency front-end circuit 4012 is connected to the device pad 4014 via the signal transmission line 4013, and the device pad 4014 is connected to the radio frequency back-end circuit 4015 also via the signal transmission line 4013. During a radio frequency conduction test, the radio frequency test probe 402 is connected to the radio frequency test instrument 404 via the radio frequency cable 403.

In addition, the radio frequency test instrument 404 is provided with two measurement ports: a first measurement port 4041 and a second measurement port 4042, and both of the two measurement ports can be used for radio frequency conduction measurement. The radio frequency test instrument 404 is further provided with a display 4043, where the display 4043 is capable of displaying parameters tested in the radio frequency conduction test, for example, power, voltage, and impedance. It can be understood that the radio frequency test instrument 404 may further include other components (for example, other buttons and interfaces), which is not specifically described herein.

It should be noted that the panel 4011 is a circuit board without any circuit device or chip welded, the board 401 may be a circuit board with a component and/or chip welded, such circuit board includes but is not limited to a ceramic circuit board, an alumina ceramic circuit board, an aluminum nitride ceramic circuit board, a line board, a printed circuit board (Printed Circuit Board, PCB), an aluminum substrate, a high-frequency board, a thick copper board, an impedance board, an ultra-thin line board, an ultra-thin circuit board, and a printed (using copper etching technology) circuit board, the device pad 4014 may include but is not limited to a patch PAD, and the signal transmission line 4013 includes but is not limited to a microstrip line.

It can be understood that, in addition to the panel 4011, the radio frequency front-end circuit 4012, the signal transmission line 4013, the device pad 4014, the radio frequency back-end circuit 4015, and the to-be-welded serial device 4016, the board 401 may include other circuit modules, where the circuit modules may include one or more components and signal transmission lines, and the signal transmission line includes but is not limited to a microstrip line.

It should also be noted that the radio frequency front-end circuit 4012 refers to a partial circuit between an antenna and an intermediate frequency (or a baseband) circuit, and signals are transmitted in the form of radio frequency in this section of circuit. For a wireless receiver, a radio frequency front-end typically includes an amplifier, a filter, a converter, and some radio frequency connecting and matching circuits. The radio frequency back-end circuit 4015 includes but is not limited to an antenna matching circuit. It can be understood that the radio frequency front-end circuit 4012 and the radio frequency back-end circuit 4015 may have various forms in circuit structure. This is not limited in this application.

In addition, the device pad 4014 is configured to connect the panel 4011 and the to-be-welded serial device 4016. It can be understood that during the radio frequency conduction test in this embodiment of this application, the board 401 may not include the to-be-welded serial device 4016. It can be understood that the serial device is one or more components connected in series with other components, for example, the serial device includes but is not limited to a device such as a resistor, a capacitor, and an inductor; and the radio frequency circuit refers to a section of circuit in which signals are transmitted in the form of radio frequency on the board 101. In an embodiment of this application, the radio frequency circuit includes but is not limited to the radio frequency front-end circuit 4012 and the radio frequency back-end circuit 4015.

Figure 5:
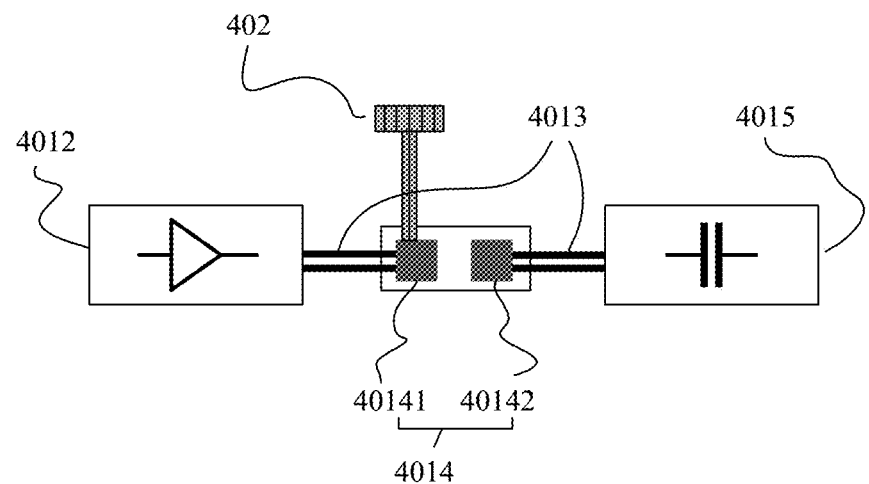
FIG. 5 is a schematic principle diagram of another radio frequency conduction test system according to an embodiment of this application.

Further, as shown in FIG. 5 that is a schematic principle diagram of another radio frequency conduction test system according to an embodiment of this application, the device pad 4014 includes a first pad 40141 and a second pad 40142, where the first pad 40141 and the second pad 40142 are not electrically connected (for example, the first pad 40141 and the second pad 40142 are not welded together), and therefore the radio frequency front-end circuit 4012 and the radio frequency back-end circuit 4015 are in an off state. It can be understood that the to-be-welded serial device 4016 shown in FIG. 4 is a device to be welded to the first pad 40141 and the second pad 40142 shown in FIG. 5.

During a radio frequency conduction test, the radio frequency test probe 402 is in contact with the first pad 40141, the first pad 40141 and the second pad 40142 are not electrically connected, that is, the first pad 40141 and the second pad 40142 are neither directly connected nor connected via an intermediate structure or through another manner, and a test signal of the radio frequency conduction test is on the first pad 40141. In this case, the test signal can be transmitted to the radio frequency test instrument 404 via the radio frequency test probe 402 through the radio frequency cable 403, so as to implement the radio frequency conduction test.

After completion of the radio frequency conduction test, the radio frequency test probe 402 is moved away. In this case, the radio frequency test probe 402 and the first pad 40141 are not electrically connected (for example, the radio frequency test probe 402 leaves the first pad 40141 for the device pad 4014), that is, the radio frequency test probe 402 and the first pad 40141 are neither directly connected nor connected via an intermediate structure or through another manner. The to-be-welded serial device 4016 is welded to the first pad 40141 and the second pad 40142, for example, welded using a process such as low-temperature reflow. The first pad 40141 and the second pad 40142 are connected via the welded serial device 4016, enabling the radio frequency front-end circuit 4012 and the radio frequency back-end circuit 4015 to be in an on state.

It can be understood that, for better transmission of the test signal on the first pad 40141 to the radio frequency test probe 402, the radio frequency test probe 402 and/or the first pad 40141 may be treated with nickel and gold plating, and optionally, the radio frequency test probe 402 and/or the first pad 40141 may alternatively be plated with another material, such as gold and nickel.

It should be noted that, in an embodiment of this application, a center-to-center distance between the first pad 40141 and the second pad 40142 is not less than 0.254 millimeter (10 mil) and not greater than 2.54 millimeters (100 mil). In another embodiment of this application, the center-to-center distance between the first pad and the second pad may alternatively be another value. This is not limited in this application. In addition, the first pad and the second pad may have various forms in size and type. This is not limited in this application.

Figure 6:
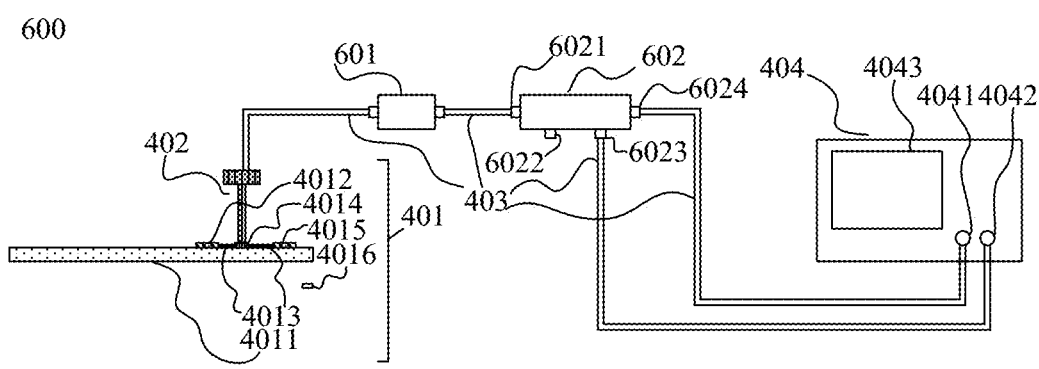
FIG. 6 is a schematic structural diagram of another radio frequency conduction test system according to an embodiment of this application.

In an embodiment of this application, an impedance conversion apparatus and a directional coupler may be added to improve accuracy of a radio frequency conduction test. As shown in FIG. 6 which is a schematic structural diagram of another radio frequency conduction test system according to an embodiment of this application, the radio frequency conduction test system 600 includes a board 401, a radio frequency test probe 402, a radio frequency cable 403, an impedance conversion apparatus 601, a directional coupler 602, and a radio frequency test instrument 404. According to the foregoing description, the board 401 includes a panel 4011, a radio frequency front-end circuit 4012, a signal transmission line 4013, a device pad 4014, a radio frequency back-end circuit 4015, and a to-be-welded serial device 4016. It can be understood that the radio frequency front-end circuit 4012, the signal transmission line 4013, the device pad 4014, and the radio frequency back-end circuit 4015 are all welded to the panel 4011, and the to-be-welded serial device 4016 is to be welded to the device pad 4014, that is, the to-be-welded serial device 4016 currently is not welded to the panel 4011 and has no connection relationship with other devices on the panel 4011. The radio frequency front-end circuit 4012 is connected to the device pad 4014 via the signal transmission line 4013, and the device pad 4014 is connected to the radio frequency back-end circuit 4015 also via the signal transmission line 4013. During a radio frequency conduction test, the radio frequency test probe 402 is connected to the impedance conversion apparatus 601 via the radio frequency cable 403, the impedance conversion apparatus 601 is connected to the directional coupler 602 via the radio frequency cable 403, and the directional coupler 602 is then connected to the radio frequency test instrument 404 via the radio frequency cable 403.

It can be understood that, for structures of the board 401 and the radio frequency test instrument 404, reference may be made to the above related description about the radio frequency conduction test system 400 shown in FIG. 4; and for a structure of the device pad 4014, reference may be made to the above related description of FIG. 5. Details are not described herein again.

It should be noted that the impedance conversion apparatus 601 includes an impedance conversion circuit, and the impedance conversion circuit can convert impedance between the radio frequency test probe 402 and the first pad 40141 into characteristic impedance. In an embodiment of this application, the characteristic impedance is 50 ohms. It can be understood that a specific circuit in the impedance conversion apparatus 601 may be changed based on actual needs. For example, a circuit structure in the impedance conversion apparatus 601 may be changed to implement conversion into characteristic impedance.

It should also be noted that the directional coupler 602 can be used to implement reflection power monitoring and transmission power compensation. This is because during a general radio frequency conduction test (for example, when a radio frequency conduction test is performed using the radio frequency conduction test system 400 shown in FIG. 4), some transmission power (for example, reflection power) cannot be transmitted, leading to low accuracy of results obtained using a radio frequency measuring instrument, and the directional coupler 602 may solve this problem to some extent. Specifically, the directional coupler 602 has four ports: an input port 6021, an isolation port 6022, a coupling output port 6023, and a straight-through output port 6024, where the coupling output port 6023 is connected to the second measurement port 4042 of the radio frequency test instrument 404, and the straight-through output port 6024 is connected to the first measurement port 4041 of the radio frequency test instrument 404. Test signals are input from the input port 6021 of the directional coupler 602, most test signals are output from the straight-through output port 6024, a small amount of test signals are output from the coupling output port 6023, and hardly any signals are output from the isolation port 6022 (in ideal cases, no test signal is output from the isolation port of the directional coupler, achieving ideal isolation; and in actual cases, leakage is present at the isolation port). Output power of an impedance path can be measured through the straight-through output port 6024, and reflection power can be measured through the coupling output port 6023, so as to implement transmission power compensation. Compared with the radio frequency conduction test system 400 shown in FIG. 4, the radio frequency conduction test system 600 shown in FIG. 6 improves accuracy of the radio frequency conduction test. It can be understood that the directional coupler 602 may be different types of directional couplers (such as a standard directional coupler and a double directional coupler). For example, the directional coupler 602 may be different types of directional couplers that can implement reflection power measurement. This is not limited in this application.

Optionally, the radio frequency test system may not include the impedance conversion apparatus or the directional coupler (as shown in FIG. 4), or may alternatively include at least one of the impedance conversion apparatus or the directional coupler (as shown in FIG. 6), or may alternatively include another apparatus or device (for example, another device or apparatus that can improve accuracy of radio frequency conduction tests). This is not limited in this application.

An embodiment of this application further provides a board for radio frequency conduction test. The board includes a radio frequency circuit, a first pad, and a second pad, where the radio frequency circuit includes a radio frequency front-end circuit and a radio frequency back-end circuit, the first pad is connected to the radio frequency front-end circuit, the second pad is connected to the radio frequency back-end circuit, the radio frequency front-end circuit and the radio frequency back-end circuit are in an off state, the first pad and the second pad are pads for a serial device to be welded into the radio frequency circuit, and a test signal on the first pad is used by a radio frequency test probe for a radio frequency conduction test.

It can be understood that, for the frequency circuit, the first pad, the second pad, and the serial device, reference may be made to the related descriptions with respect to FIG. 4, FIG. 5, and FIG. 6; and the board may be the board that includes the panel 4011, the radio frequency front-end circuit 4012, the signal transmission line 4013, the device pad 4014 (including the first pad 40141 and the second pad 40142), the radio frequency back-end circuit 4015, and the to-be-welded serial device 4016 as shown in FIG. 4, FIG. 5, and FIG. 6, or the board may alternatively be another board that has the above structure and connection relationship and that can be applied to a board for radio frequency conduction test.

It can be understood that the first pad of the board may be treated with nickel and gold plating, and optionally, the first pad may alternatively be plated with another material, such as gold and nickel.

It should be noted that, in an embodiment of this application, a center-to-center distance between the first pad and the second pad is not less than 0.254 millimeter (10 mil) and not greater than 2.54 millimeters (100 mil). In another embodiment of this application, the center-to-center distance between the first pad and the second pad may alternatively be another value. This is not limited in this application. In addition, the first pad and the second pad may have various forms in size and type. This is not limited in this application.

An embodiment of this application further provides a board that has been subjected to a radio frequency conduction test. The board includes a radio frequency circuit, a first pad, a second pad, and a serial device, where the radio frequency circuit includes a radio frequency front-end circuit and a radio frequency back-end circuit, the first pad is connected to the radio frequency front-end circuit, the second pad is connected to the radio frequency back-end circuit, and the serial device is a device that is welded to the first pad and the second pad in the radio frequency circuit.

Figure 7:
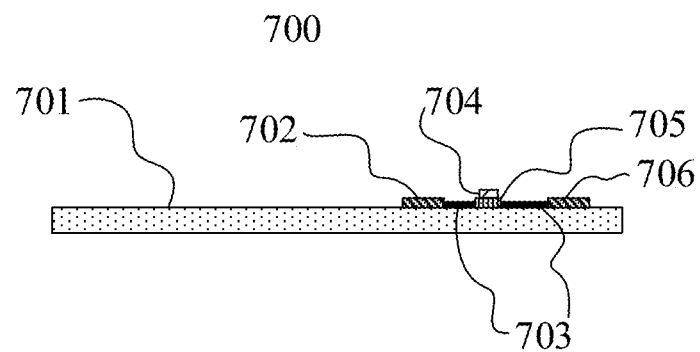
FIG. 7 is a schematic structural diagram of a board that has been subjected to a radio frequency conduction test according to an embodiment of this application.

For example, as shown in FIG. 7 which is a schematic structural diagram of a board that has been subjected to a radio frequency conduction test according to an embodiment of this application, the board 700 shown in FIG. 7 includes a panel 701, a radio frequency front-end circuit 702, a signal transmission line 703, a serial device 704, a device pad 705, and a radio frequency back-end circuit 706. It can be understood that the radio frequency front-end circuit 702, the signal transmission line 703, the device pad 705, and the radio frequency back-end circuit 706 are all welded to the panel 701, the serial device 704 is welded to the device pad 705, the radio frequency front-end circuit 702 is connected to the device pad 705 via the signal transmission line 703, and the device pad 705 is connected to the radio frequency back-end circuit 706 also via the signal transmission line 703.

It should be noted that the panel 701 is a circuit board without any circuit device or chip welded, the board 700 may be a circuit board with a component and/or chip welded, such circuit board includes but is not limited to a ceramic circuit board, an alumina ceramic circuit board, an aluminum nitride ceramic circuit board, a line board, a printed circuit board (Printed Circuit Board, PCB), an aluminum substrate, a high-frequency board, a thick copper board, an impedance board, an ultra-thin line board, an ultra-thin circuit board, and a printed (using copper etching technology) circuit board, and the signal transmission line 703 includes but is not limited to a microstrip line.

It can be understood that, in addition to the panel 701, the radio frequency front-end circuit 702, the signal transmission line 703, the serial device 704, the device pad 705, and the radio frequency back-end circuit 706, the board 700 may further include other circuit modules, where the circuit modules may include one or more components and signal transmission lines.

It should also be noted that the radio frequency front-end circuit 702 refers to a partial circuit between an antenna and an intermediate frequency (or a baseband) circuit, and signals are transmitted in the form of radio frequency in this section of circuit. For a wireless receiver, a radio frequency front-end typically includes an amplifier, a filter, a converter, and some radio frequency connecting and matching circuits. The radio frequency back-end circuit 706 includes but is not limited to an antenna matching circuit. It can be understood that the radio frequency front-end circuit 702 and the radio frequency back-end circuit 706 may have various forms in circuit structure. This is not limited in this application.

In addition, the device pad 705 is configured to connect the panel 701 and the serial device 704, and the serial device 704 is one or more components connected in series with other components, for example, the serial device includes but is not limited to a device such as a resistor, a capacitor, and an inductor. The radio frequency circuit refers to a section of circuit in which signals are transmitted in the form of radio frequency on the board 700. In an embodiment of this application, the radio frequency circuit includes but is not limited to the radio frequency front-end circuit 702 and the radio frequency back-end circuit 706.

Figure 8:
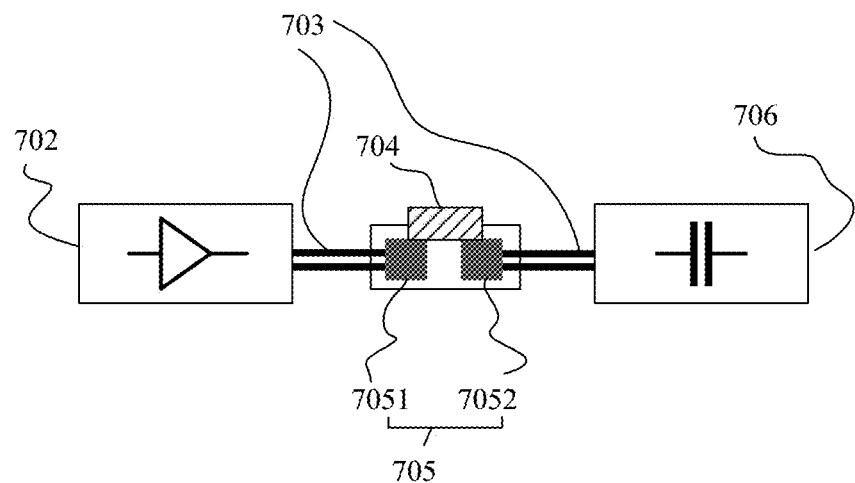
FIG. 8 is a schematic structural diagram of another board that has been subjected to a radio frequency conduction test according to an embodiment of this application.

For example, as shown in FIG. 8 that is a schematic structural diagram of another board that has been subjected to a radio frequency conduction test according to an embodiment of this application, the device pad 705 includes a first pad 7051 and a second pad 7052, where the first pad 7051 is connected to the radio frequency front-end circuit 702 via the signal transmission line 703, the second pad 7052 is connected to the radio frequency back-end circuit 706 via the signal transmission line 703, and the serial device 704 is welded to the first pad 7051 and the second pad 7052. When the board 700 is working, a signal on the board 700 is transmitted from the radio frequency front-end circuit 702 to the first pad 7051 through the signal transmission line 703, then to the second pad 7052 through the serial device 704, and then transmitted to the radio frequency back-end circuit 706 through the signal transmission line 703.

It can be understood that the first pad 7051 of the board 700 that has been subjected to a radio frequency conduction test may be treated with nickel and gold plating, and optionally, the first pad 7051 may alternatively be plated with another material, such as gold and nickel.

It should be noted that, in an embodiment of this application, a center-to-center distance between the first pad 7051 and the second pad 7052 is not less than 0.254 millimeter (10 mil) and not greater than 2.54 millimeters (100 mil). In another embodiment of this application, the center-to-center distance between the first pad and the second pad may alternatively be another value. This is not limited in this application. In addition, the first pad and the second pad may have various forms in size and type. This is not limited in this application. It can be understood that, in an embodiment of this application, the board that has been subjected to a radio frequency conduction test may not include a radio frequency test switch socket. In another embodiment of this application, the board that has been subjected to a radio frequency conduction test may alternatively be another board that has the above structure and connection relationship and that has been subjected to a radio frequency conduction test. This is not limited in this application.

Figure 9:
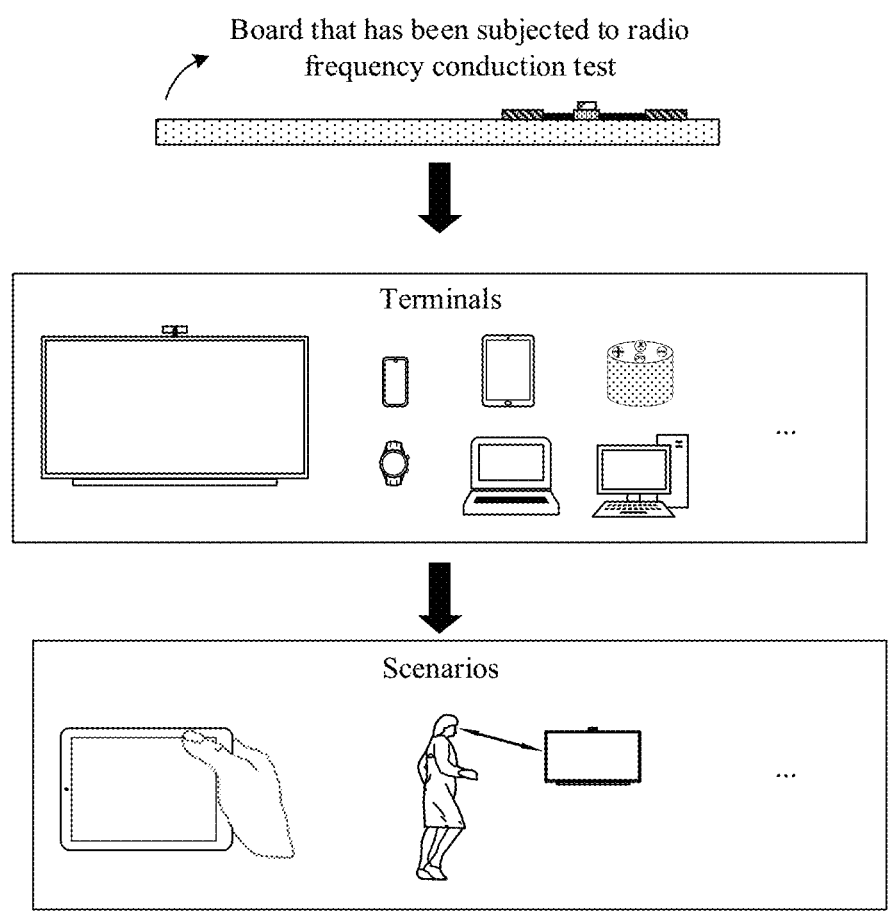
FIG. 9 is a schematic diagram of different terminals according to an embodiment of this application.

This application further provides a terminal, where the terminal includes the board that has been subjected to a radio frequency conduction test. As shown in FIG. 9 that is a schematic diagram of different terminals according to an embodiment of this application, the terminal may be a terminal including the board that has been subjected to a radio frequency conduction test, for example, a mobile phone, a PC, a tablet computer, a smart watch, and a smart speaker box.

Figure 10:
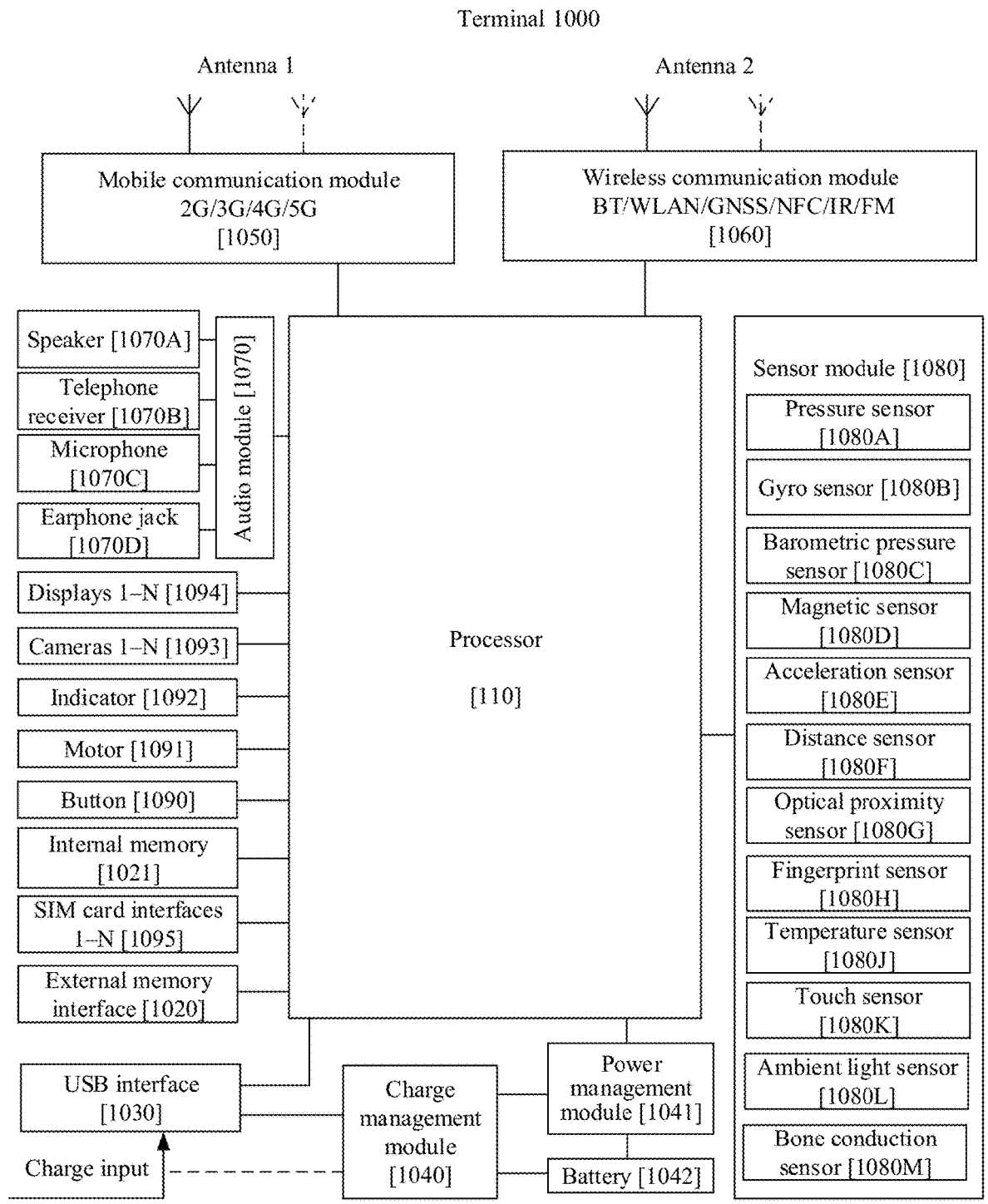
FIG. 10 is a schematic structural diagram of a terminal according to an embodiment of this application.

For example, as shown in FIG. 10 which is a schematic structural diagram of a terminal according to this application, the terminal includes the board that has been subjected to a radio frequency conduction test. The following describes the terminal 1000 shown in FIG. 10 in detail.

The terminal 1000 may include a processor 1010, an external memory interface 1020, an internal memory 1021, a universal serial bus (universal serial bus, USB) interface 1030, a charge management module 1040, a power management module 1041, a battery 1042, an antenna 1, an antenna 2, a mobile communication module 1050, a wireless communication module 1060, an audio module 1070, a speaker 1070A, a telephone receiver 1070B, a microphone 1070C, an earphone jack 1070D, a sensor module 1080, a button 1090, a motor 1091, an indicator 1092, a camera 1093, a display 1094, a subscriber identification module (subscriber identification module, SIM) card interface 1095, and the like. The sensor module 1080 may include a pressure sensor 1080A, a gyro sensor 1080B, a barometric pressure sensor 1080C, a magnetic sensor 1080D, an acceleration sensor 1080E, a distance sensor 1080F, an optical proximity sensor 1080G, a fingerprint sensor 1080H, a temperature sensor 1080J, a touch sensor 1080K, an ambient light sensor 1080L, a bone conduction sensor 1080M, and the like.

It can be understood that a structure illustrated in this embodiment of this application does not constitute a specific limitation on the terminal 1000. In some other embodiments of this application, the terminal 1000 may include more or fewer components than shown in the figure, or combine some of the components, split some of the components, or arrange the components differently. The components shown in the figure may be implemented by using hardware, software, or a combination of software and hardware.

The processor 1010 may include one or more processing units. For example, the processor 1010 may include an application processor (Application Processor, AP), a modem processor, a graphics processing unit (Graphics Processing unit, GPU), an image signal processor (Image Signal Processor, ISP), a controller, a memory, a video codec, a digital signal processor (Digital Signal Processor, DSP), a baseband processor, a neural-network processing unit (Neural-network Processing Unit, NPU), and/or the like. Different processing units may be separate devices or may be integrated into one or more processors.

The controller may be a nerve center and command center of the terminal 1000. The controller may generate an operation control signal according to instruction operation code and a timing signal to complete control of instruction fetching and execution.

The processor 1010 may be further provided with a memory for storing instructions and data. In some embodiments, the memory in the processor 1010 is a cache. The memory may store instructions or data just used or repeatedly used by the processor 1010. If the processor 1010 needs to use the instructions or data again, the processor 1010 may directly invoke the instructions or data from the memory. This avoids repeated access and reduces waiting time of the processor 1010, thereby improving system efficiency.

In some embodiments, the processor 1010 may include one or more interfaces. The interface may include an inter-integrated circuit (Inter-Integrated Circuit, I2C) interface, an inter-integrated circuit sound (Inter-Integrated Circuit Sound, I2S) interface, a pulse code modulation (Pulse Code Modulation, PCM) interface, a universal asynchronous receiver/transmitter (Universal Asynchronous Receiver/Transmitter, UART) interface, a mobile industry processor interface (Mobile Industry Processor Interface, MIPI), a general-purpose input/output (General-Purpose Input/output, GPIO) interface, a subscriber identity module (Subscriber Identity Module, SIM) interface, a universal serial bus (universal serial bus, USB) interface, and/or the like.

The I2C interface is a bidirectional synchronous serial bus and includes a serial data line (Serial Data Line, SDA) and a serial clock line (Serial Clock Line, SCL). In some embodiments, the processor 1010 may include a plurality of groups of I2C buses. The processor 1010 may be coupled to the touch sensor 1080K, a charger, a flash, the camera 1093, and the like through different I2C bus interfaces. For example, the processor 1010 may be coupled to the touch sensor 1080K through the I2C interface, so that the processor 1010 communicates with the touch sensor 1080K through the I2C bus interface to implement a touch function of the terminal 1000.

The I2S interface may be used for audio communication. In some embodiments, the processor 1010 may include a plurality of groups of I2S buses. The processor 1010 may be coupled to the audio module 1070 through an I2S bus to implement communication between the processor 1010 and the audio module 1070. In some embodiments, the audio module 1070 may transmit audio signals to the wireless communication module 1060 through the I2S interface, so as to implement a function of answering calls through a Bluetooth earphone.

The PCM interface may also be used for audio communication for sampling, quantizing, and encoding on analog signals. In some embodiments, the audio module 1070 may be coupled to the wireless communication module 1060 through a PCM bus interface. In some embodiments, the audio module 1070 may alternatively transmit audio signals to the wireless communication module 1060 through the PCM interface, so as to implement the function of answering calls through a Bluetooth earphone. Both the I2S interface and the PCM interface may be used for audio communication.

The UART interface is a universal serial data bus used for asynchronous communication. The bus may be a bidirectional communication bus that switches transmission of to-be-transmitted data between serial communication and parallel communication. In some embodiments, the UART interface is typically configured to connect the processor 1010 and the wireless communication module 1060. For example, the processor 1010 communicates with a Bluetooth module of the wireless communication module 1060 through the UART interface to implement a Bluetooth function. In some embodiments, the audio module 1070 may transmit audio signals to the wireless communication module 1060 through the UART interface, so as to implement a function of playing music through a Bluetooth earphone.

The MIPI interface may be configured to connect the processor 1010 and a peripheral device such as the display 1094 and the camera 1093. The MIPI interface includes a camera serial interface (Camera Serial Interface, CSI, CSI), a display serial interface (Display Serial Interface, DSI, DSI), and the like. In some embodiments, the processor 1010 communicates with the camera 1093 through the CSI interface, so as to implement a shooting function of the terminal 1000. The processor 1010 communicates with the display 1094 through the DSI interface to implement a display function of the terminal 1000.

The GPIO interface may be configured by using software. The GPIO interface may be configured as a control signal interface or a data signal interface. In some embodiments, the GPIO interface may be configured to connect the processor 1010 to the camera 1093, the display 1094, the wireless communication module 1060, the audio module 1070, the sensor module 1080, and the like. The GPIO interface may alternatively be configured as an I2C interface, an I2S interface, a UART interface, an MIPI interface, or the like.

The SIM interface may be configured to communicate with the SIM card interface 1095 to implement a function of transmitting data to a SIM card or reading data in a SIM card.

The USB interface 1030 is an interface that complies with the USB standard specification, and may specifically be a mini USB interface, a micro USB interface, a USB type C interface, or the like. The USB interface 1030 may be configured to connect a charger to charge the terminal 1000, may be configured to transmit data between the terminal 1000 and a peripheral device, and may also be configured to connect an earphone to play audio by using the earphone. The interface may be further configured to connect another electronic device, for example, an AR device.

It can be understood that an interface connection relationship between the modules shown in this embodiment of this application is merely an example for description and does not constitute any limitation on the structure of the terminal 1000. In some other embodiments of this application, the terminal 1000 may alternatively use an interface connection manner different from those in the foregoing embodiments or a combination of a plurality of interface connection manners.

The charge management module 1040 is configured to receive charge input from a charger. The charger may be a wireless charger or a wired charger.

The power management module 1041 is configured to connect the battery 1042, the charge management module 1040, and the processor 1010. The power management module 1041 receives input from the battery 1042 and/or the charge management module 1040 to supply power to the processor 1010, the internal memory 1021, an external memory, the display 1094, the camera 1093, the wireless communication module 1060, and the like.

A wireless communication function of the terminal 1000 may be implemented by using the antenna 1, the antenna 2, the mobile communication module 1050, the wireless communication module 1060, the modem processor, the baseband processor, and the like.

The antenna 1 and the antenna 2 are configured to transmit and receive electromagnetic wave signals. Each antenna of the terminal 1000 may be configured to cover one or more communication bands. Different antennas may further support multiplexing so as to increase antenna utilization. For example, the antenna 1 may be used also as a diversity antenna of a wireless local area network. In some other embodiments, the antenna may be used in combination with a tuning switch.

The mobile communication module 1050 may provide wireless communication solutions including 2G, 3G, 4G, 5G, and the like which are applied to the terminal 1000. The mobile communication module 1050 may include at least one filter, a switch, a power amplifier, a low noise amplifier (low noise amplifier, LNA), and the like. The mobile communication module 1050 may receive an electromagnetic wave by using the antenna 1, perform processing such as filtering and amplification on the received electromagnetic wave, and transmit the processed electromagnetic wave to the modem processor for demodulation. The mobile communication module 1050 may further amplify a signal modulated by the modem processor and convert the signal into an electromagnetic wave and radiate the electromagnetic wave by using the antenna 1. In some embodiments, at least some functional modules of the mobile communication module 1050 may be provided in the processor 1010. In some embodiments, at least some functional modules of the mobile communication module 1050 may be provided in a same device with at least some modules of the processor 1010.

The modem processor may include a modulator and a demodulator. The modulator is configured to modulate a low frequency baseband signal that is to be transmitted into a medium or high frequency signal. The demodulator is configured to demodulate a received electromagnetic wave signal into a low frequency baseband signal. Then, the demodulator transmits the low frequency baseband signal obtained through demodulation to the baseband processor for processing. After being processed by the baseband processor, the low frequency baseband signal is transferred to the application processor. The application processor outputs a sound signal by using an audio device (not limited to the speaker 1070A, the telephone receiver 1070B, and the like), or displays an image or a video by using the display 1094. In some embodiments, the modem processor may be a separate device. In some other embodiments, the modem processor may be separate from the processor 1010 and provided in a same device together with the mobile communication module 1050 or another functional module.

The wireless communication module 1060 may provide wireless communication solutions applied to the terminal 1000, including wireless local area network (Wireless Local Area Networks, WLAN) (for example, wireless fidelity (Wireless Fidelity, Wi-Fi) network), Bluetooth (Bluetooth, BT), global navigation satellite system (Global Navigation Satellite System, GNSS), frequency modulation (Frequency Modulation, FM), near field communication (Near Field Communication, NFC), infrared (Infrared, IR), and the like. The wireless communication module 1060 may be one or more devices integrating at least one communication processing module. The wireless communication module 1060 receives an electromagnetic wave by using the antenna 2, performs frequency modulation and filtering processing on the electromagnetic wave signal, and transmits the processed signal to the processor 1010. The wireless communication module 1060 may further receive a to-be-sent signal from the processor 1010, perform frequency modulation and amplification on the signal, and convert the signal into an electromagnetic wave and radiate the electromagnetic wave by using the antenna 2.

In some embodiments, the antenna 1 of the terminal 1000 is coupled to the mobile communication module 1050, and the antenna 2 is coupled to the wireless communication module 1060, so that the terminal 1000 can communicate with a network and another device by using a wireless communication technology. The wireless communication technology may include global system for mobile communications (Global System for Mobile Communications, GSM), general packet radio service (General Packet Radio Service, GPRS), code division multiple access (Code Division Multiple Access, CDMA), wideband code division multiple access (Wideband Code Division Multiple Access, WCDMA), time-division code division multiple access (Time-Division Code Division Multiple Access, TD-SCDMA), long term evolution (Long Term Evolution, LTE), BT, GNSS, WLAN, NFC, FM, IR, and/or the like. The GNSS may include the global positioning system (Global Positioning System, GPS), the global navigation satellite system (Global Navigation Satellite System, GLONASS), the Beidou navigation satellite system (BeiDou Navigation Satellite System, BDS), the quasi-zenith satellite system (Quasi-Zenith Satellite System, QZSS), and/or the satellite based augmentation systems (Satellite Based Augmentation Systems, SBAS).

The terminal 1000 implements a display function by using the GPU, the display 1094, the application processor, and the like. The GPU is an image processing microprocessor and is connected to the display 1094 and the application processor. The GPU is configured to perform mathematical and geometric computation graphics rendering. The processor 1010 may include one or more GPUs that execute program instructions to generate or change display information.

The display 1094 is configured to display an image, a video, and the like. The display 1094 includes a display panel. The display panel may use a liquid crystal display (Liquid Crystal Display, LCD), organic light-emitting diode (Organic Light-Emitting Diode, OLED), active-matrix organic light emitting diode or an active matrix organic light emitting diode (Active-Matrix Organic Light Emitting Diode, AMOLED), flex light-emitting diode (Flex Light-Emitting Diode, FLED), a mini LED, micro LED, micro-OLED, quantum dot light emitting diodes (Quantum Dot Light Emitting Diodes, QLED), or the like. In some embodiments, the terminal 1000 may include one or N displays 1094, where N is a positive integer greater than 1.

The terminal 1000 may implement a photographing function by using the ISP, the camera 1093, the video codec, the GPU, the display 1094, the application processor, and the like.

The ISP is configured to process data fed back by the camera 1093. For example, during photographing, a shutter is open, allowing light to be transmitted to a photosensitive element of the camera through a lens. An optical signal is converted into an electrical signal. The photosensitive element of the camera transfers the electrical signal to the ISP for processing, so as to convert the electrical signal into an image visible to naked eyes. The ISP may further optimize noise, brightness, and skin color of the image using algorithms. The ISP may further optimize parameters such as exposure and color temperature of a shooting scene. In some embodiments, the ISP may be disposed in the camera 1093.

The camera 1093 is configured to capture a static image or a video. An optical image of an object is generated by using a lens and is projected to a photosensitive element. The photosensitive element may be a charge coupled device (Charge Coupled Device, CCD) or a complementary metal-oxide-semiconductor (Complementary Metal-Oxide-Semiconductor, CMOS) phototransistor. The photosensitive element converts an optical signal into an electrical signal, and then transfers the electrical signal to the ISP to convert the electrical signal into a digital image signal. The ISP outputs the digital image signal to the DSP for processing. The DSP converts the digital image signal into an image signal in a standard format such as RGB or YUV. In some embodiments, the terminal 1000 may include one or N cameras 1093, where N is a positive integer greater than 1.

The digital signal processor is configured to process digital signals, including not only digital image signals but also other digital signals. For example, when the terminal 1000 is performing frequency selection, the digital signal processor is configured to perform Fourier transform on energy of frequencies.

The video codec is configured to compress or decompress a digital video. The terminal 1000 may support one or more types of video codecs, so that the terminal 1000 can play or record videos in a plurality of coding formats such as moving picture experts group (Moving Picture Experts Group, MPEG) 1, MPEG2, MPEG3, and MPEG4.

The NPU is a neural-network (Neural-Network, NN) computing processor. By referring to a structure of a biological neural network, for example to a transmission mode between neurons in a human-brain, the NPU quickly processes input information and is also capable of continuous self-learning. The NPU may be used for implementing applications such as intelligent cognition of the terminal 1000, for example, image recognition, facial recognition, speech recognition, and text understanding.

The external memory interface 1020 may be configured to connect an external memory card, for example, a micro SD card, to extend a storage capacity of the terminal 1000. The external memory card communicates with the processor 1010 by using the external memory interface 1020 to implement a data storage function. For example, files such as music and video files are stored in the external storage card.

The internal memory 1021 may be configured to store computer executable program code, where the executable program code includes instructions. The processor 1010 executes various functional applications of the terminal 1000 and data processing by executing the instructions stored in the internal memory 1021. The internal memory 1021 may include a program storage area and a data storage area. The program storage area may store an operating system, an application required by at least one function (for example, a facial recognition function, a fingerprint recognition function, and a mobile payment function), and the like. The data storage area may store data (for example, facial information template data and fingerprint information template) and the like that are created during use of the terminal 1000. In addition, the internal memory 1021 may include a high-speed random access memory, and may further include a non-volatile memory, for example, at least one magnetic disk storage device, a flash memory device, and a universal flash storage (Universal Flash Storage, UFS).

The terminal 1000 may use the audio module 1070, the speaker 1070A, the telephone receiver 1070B, the microphone 1070C, the earphone port 1070D, the application processor, and the like to implement an audio function, for example, music playing and sound recording.

The audio module 1070 is configured to convert digital audio information into an analog audio signal for output, and is also configured to convert analog audio input into a digital audio signal. The audio module 1070 may be further configured to encode and decode audio signals. In some embodiments, the audio module 1070 may be provided in the processor 1010, or some functional modules of the audio module 1070 may be provided in the processor 1010.

The speaker 1070A, also referred to as a "loudspeaker", is configured to convert audio electrical signals into sound signals. The terminal 1000 may be used for listening to music or answering a hands-free call by using the speaker 1070A.

The telephone receiver 1070B, also referred to as an "earpiece", is configured to convert audio electrical signals into sound signals. When the terminal 1000 receives a call or a voice message, the telephone receiver 1070B may be placed near a human ear for listening to a voice.

The microphone 1070C, also referred to as a "mic" or "mike", is configured to convert sound signals into electrical signals. When making a call or sending a voice message, a user may input a sound signal into the microphone 1070C by speaking close to the microphone 1070C. The terminal 1000 may be provided with at least one microphone 1070C. In some other embodiments, the terminal 1000 may be provided with two microphones 1070C to reduce noise in addition to collecting sound signals. In some other embodiments, the terminal 1000 may alternatively be provided with three, four, or more microphones 1070C to collect sound signals, reduce noise, identify a sound source, implement directional recording, and the like.

The earphone jack 1070D is configured to connect a wired earphone. The earphone jack 1070D may be the USB interface 1030, or may be a 3.5 mm open mobile terminal platform (Open Mobile Terminal Platform, OMTP) standard interface, or a cellular telecommunications industry association of the USA (Cellular Telecommunications Industry Association of the USA, CTIA) standard interface.

The pressure sensor 1080A is configured to sense a pressure signal, and can convert the pressure signal into an electrical signal. In some embodiments, the pressure sensor 1080A may be disposed on the display 1094. There are many types of pressure sensors 1080A, such as a resistive pressure sensor, an inductive pressure sensor, and a capacitive pressure sensor. The capacitive pressure sensor may include at least two parallel plates having a conductive material. When a force is applied to the pressure sensor 1080A, capacitance between electrodes changes. The terminal 1000 determines pressure intensity based on a change of capacitance. When a touch operation is performed on the display 1094, the terminal 1000 detects a strength of the touch operation by using the pressure sensor 1080A. The terminal 1000 may further calculate a touch position based on a detection signal of the pressure sensor 1080A. In some embodiments, touch operations that are performed on a same touch position but have different touch operation strengths may correspond to different operation instructions. For example, when a touch operation whose touch operation strength is less than a first pressure threshold is performed on a messaging application icon, an instruction for viewing messages is executed; or when a touch operation whose touch operation strength is greater than or equal to the first pressure threshold is performed on the messaging application icon, an instruction for creating a new message is executed.

The gyro sensor 1080B may be configured to determine a motion posture of the terminal 1000. In some embodiments, angular velocities of the terminal 1000 around three axes (namely, x, y, and z axes) may be determined by using the gyroscope sensor 1080B. The gyro sensor 1080B may be used for image stabilization during photographing. For example, when the shutter is pressed, the gyro sensor 1080B detects a shaking angle of the terminal 1000, and calculates, based on the angle, a distance for which a lens module needs to compensate, so as to cancel shaking of the terminal 1000 through reverse motion of the lens, thereby implementing image stabilization. The gyro sensor 1080B may be further used for navigation and somatosensory game scenarios.

The barometric pressure sensor 1080C is configured to measure atmospheric pressure. In some embodiments, the terminal 1000 calculates an altitude based on an atmospheric pressure value measured by the atmospheric pressure sensor 1080C to assist positioning and navigation.

The magnetic sensor 1080D includes a Hall sensor. The terminal 1000 may detect opening and closing of a clamshell or a smart cover by using the magnetic sensor 1080D. In some embodiments, when the terminal 1000 is a clamshell device, the terminal 1000 may detect opening and closing of a clamshell by using the magnetic sensor 1080D. Then, a feature such as automatic unlocking upon opening of the clamshell is set based on a detected opening or closing state of the smart cover or a detected opening or closing state of the clamshell.

The acceleration sensor 1080E may detect magnitudes of accelerations of the terminal 1000 in all directions (generally along three axes), may detect a magnitude and direction of gravity when the terminal 1000 is static, and may be further configured for recognition of a posture of the electronic device, applied for applications such as landscape/portrait mode switching and pedometer.

The distance sensor 1080F is configured to measure distance. The terminal 1000 may measure a distance by using infrared or laser. In some embodiments, in a shooting scenario, the terminal 1000 may use the distance sensor 1080F to measure a distance for rapid focusing.

The optical proximity sensor 1080G may include, for example, a light-emitting diode (LED) and an optical detector, such as a photodiode. The light-emitting diode may be an infrared light-emitting diode. The terminal 1000 emits infrared light outward by using the light-emitting diode. The terminal 1000 detects infrared light reflected from nearby objects by using the photodiode. When sufficient reflected light is detected, the terminal 1000 can determine that an object is near the terminal 1000. When insufficient reflected light is detected, the terminal 1000 can determine that no object is near the terminal 1000. The terminal 1000 may detect, by using the optical proximity sensor 1080G, that a user is holding the terminal 1000 close to an ear to make or answer a call, and then automatically turns off the screen to save power. The optical proximity sensor 1080G may also be used in a smart cover mode or a pocket mode to automatically perform screen unlocking or locking.

The ambient light sensor 1080L is configured to sense brightness of ambient light. The terminal 1000 may adaptively adjust brightness of the display 1094 based on the sensed brightness of the ambient light. The ambient light sensor 1080L may also be configured to automatically adjust white balance during photographing. The ambient light sensor 1080L may also cooperate with the proximity light sensor 1080G to detect whether the terminal 1000 is in a pocket to avoid accidental touches.

The fingerprint sensor 1080H is configured to collect fingerprints. The terminal 1000 may implement fingerprint unlock, application access lock, fingerprint photographing, fingerprint-based call answering, and the like by using characteristics of the collected fingerprint.

The temperature sensor 1080J is configured to detect a temperature. In some embodiments, the terminal 1000 executes a temperature processing policy by using the temperature detected by the temperature sensor 1080J. For example, when a temperature reported by the temperature sensor 1080J exceeds a threshold, the terminal 1000 degrades performance of a processor near the temperature sensor 1080J to reduce power consumption and implement thermal protection. In some other embodiments, when the temperature is lower than another threshold, the terminal 1000 heats the battery 1042 to avoid abnormal shutdown of the terminal 1000 caused by low temperature. In some other embodiments, when the temperature is lower than still another threshold, the terminal 1000 boosts an output voltage of the battery 1042 to avoid abnormal shutdown caused by low temperature.

The touch sensor 1080K is also referred to as a "touch panel". The touch sensor 1080K may be disposed on the display 1094, and the touch sensor 1080K and the display 1094 form a touchscreen, also referred to as a "touch screen". The touch sensor 1080K is configured to detect a touch operation performed on or near the touch sensor 1080K. The touch sensor may transfer a detected touch operation to the application processor to determine a touch event type. A visual output related to the touch operation may be provided by using the display 1094. In some other embodiments, the touch sensor 1080K may alternatively be disposed on a surface of the terminal 1000, that is, at a location different from that of the display 1094.

The button 1090 includes a power on/off button, a volume button, and the like. The button 1090 may be a mechanical button, or may be a touch button. The terminal 1000 may receive a button input to generate a button signal input associated with user settings and function control of the terminal 1000.

The motor 1091 may generate vibration alerts. The motor 1091 may be configured to provide a vibration alert for an incoming call, and may also be configured to provide a vibration feedback for a touch. For example, touch operations performed on different applications (for example, photographing and audio playing) may be corresponding to different vibration feedback effects. The motor 1091 may also correspondingly provide different vibration feedback effects for touch operations performed on different areas of the display 1094. Different application scenarios (for example, time reminder, message reception, alarm clock, and gaming) may also be corresponding to different vibration feedback effects. In addition, touch vibration feedback effects can be user-defined.

The indicator 1092 may be an indicator lamp and may be configured to indicate a charging status and power change, and may also be configured to indicate a message, a missed call, a notification, and the like.

The SIM card interface 1095 is configured to connect a SIM card. The SIM card may be inserted into the SIM card interface 1095 or pulled out from the SIM card interface 1095 to achieve contact with or separation from the terminal 1000. The terminal 1000 may support one or N SIM card interfaces, where N is a positive integer greater than 1. The SIM card interface 1095 may support a nano SIM card, a micro SIM card, a SIM card, and the like. A plurality of cards may be inserted into one SIM card interface 1095 at the same time. The plurality of SIM cards may be of a same type or different types. The SIM card interface 1095 may also be compatible with different types of SIM cards. The SIM card interface 1095 may also be compatible with an external memory card. The terminal 1000 interacts with a network by using a SIM card to implement functions such as call and data communication.

It can be understood that the terminal 1000 may have more or fewer components than shown in the figure, may combine two or more components, or may have different component configurations. The components shown in the figure may be implemented in hardware that includes one or more signal processing and/or application-specific integrated circuits, in software, or in a combination of hardware and software.

It should be noted that, in an embodiment of this application, the terminal includes the board 700 shown in FIG. 7, and the mobile communication module 1050 and/or the wireless communication module 1060 of the terminal 1000 may include the radio frequency front-end circuit 702, the conduction unit 704 serial device 704, and the radio frequency back-end circuit 706 that are on the board 700.

Figure 11:
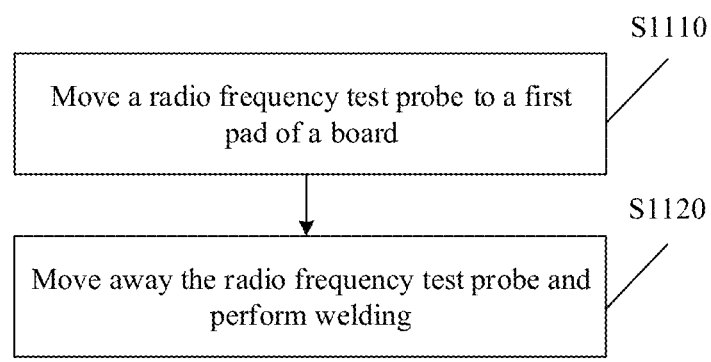
FIG. 11 is a schematic flowchart of a radio frequency conduction test method according to an embodiment of this application.

Based on the foregoing content, an embodiment of this application provides a radio frequency conduction test method which can be applied to the radio frequency conduction test systems shown in FIG. 4, FIG. 5, and FIG. 6. FIG. 11 is a schematic flowchart of a radio frequency conduction test method according to an embodiment of this application. The method includes but is not limited to the following steps.

S1110. Move a radio frequency test probe to a first pad of a board.

Specifically, a radio frequency test probe is moved to a first pad of a board so as to allow a test signal on the first pad to be transmitted to the radio frequency test probe for testing, where the board includes a radio frequency front-end circuit, a radio frequency back-end circuit, the first pad, a second pad, and a to-be-welded serial device; the to-be-welded serial device is a device to be welded to the first pad and the second pad; and the first pad is connected to the radio frequency front-end circuit, the second pad is connected to the radio frequency back-end circuit, and the radio frequency front-end circuit and the radio frequency back-end circuit are in an off state.

For example, the radio frequency test probe 402 is moved to the first pad 40141 of a board so as to allow a test signal on the first pad 40141 to be transmitted to the radio frequency test probe 402 for testing, where the board may be the board 401 in FIG. 4, FIG. 5, and FIG. 6.

It can be understood that the board includes but is not limited to the board 401 shown in FIG. 4, FIG. 5, and FIG. 6. This is not limited in this application. It should be noted that a radio frequency conduction test can be performed only after a board is set to a working state (only in this case, there is a test signal in the board). In an actual test, the board may be adjusted according to specific requirements of the radio frequency conduction test, so that a test signal for the radio frequency conduction test can be obtained.

It should also be noted that, when the radio frequency test probe is moved to the first pad of the board, the radio frequency front-end circuit and the radio frequency back-end circuit of the board are in an off state, and the test signal can be transmitted from the first pad to the radio frequency test probe. Optionally, the test signal in the radio frequency test probe may be transmitted to a radio frequency test instrument (as shown in FIG. 4) via an impedance conversion apparatus; or, the test signal in the radio frequency test probe is transmitted to the radio frequency test instrument via a directional coupler; or alternatively, the test signal in the radio frequency test probe is transmitted to the radio frequency test instrument via an impedance conversion apparatus and a directional coupler (as shown in FIG. 6). In an embodiment of this application, when the test signal in the radio frequency test probe is transmitted to the radio frequency test instrument via an impedance conversion apparatus and a directional coupler, a straight-through output port of the directional coupler is connected to a first measurement port of the radio frequency test instrument, and a coupling output port of the directional coupler is connected to a second measurement port of the radio frequency test instrument.

It can be understood that, for better transmission of the test signal on the first pad to the radio frequency test probe, the radio frequency test probe and/or the first pad may be treated with nickel and gold plating, and optionally, the radio frequency test probe and/or the first pad may alternatively be plated with another material, such as gold and nickel. For example, in an embodiment of this application, when the radio frequency test probe is moved to the first pad of the board, a first portion of the radio frequency test probe is in contact with a second portion of the first pad, the test signal is transmitted from the second portion of the first pad to the first portion of the radio frequency test probe, and the first portion and/or the second portion is treated with nickel and gold plating.

It should be noted that, in an embodiment of this application, a center-to-center distance between the first pad and the second pad is not less than 0.254 millimeter (10 mil) and not greater than 2.54 millimeters (100 mil). In another embodiment of this application, the center-to-center distance between the first pad and the second pad may alternatively be another value. This is not limited in this application. In addition, the first pad and the second pad may have various forms in size and type. This is not limited in this application.

S1120. Move away the radio frequency test probe and perform welding.

Specifically, after completion of the radio frequency conduction test, the radio frequency test probe is moved away and the serial device is welded to the first pad and the second pad so as to enable the radio frequency front-end circuit and the radio frequency back-end circuit to be in an on state and to obtain the board that has been subjected to the radio frequency conduction test.

It can be understood that a manner of the welding includes but is not limited to low-temperature reflow soldering and laser welding, and the board that has been subjected to the radio frequency conduction test includes but is not limited to the boards shown in FIG. 7 and FIG. 8.

It should be noted that the above radio frequency conduction test method may be performed manually, or may be performed using an automated machine and other equipment with functions capable of implementing the above method. This is not limited in this application.

It should also be noted that the above radio frequency conduction test method may be applied to other modules or apparatuses requiring a radio frequency conduction test. This is not limited in this application.

In the foregoing embodiments, the descriptions of these embodiments have different focuses. For a part not described in detail in one embodiment, reference may be made to the related descriptions in other embodiments.

It should be understood that the first, second, third, fourth and numbers in this specification are merely for differentiation for ease of description, and are not intended to limit the scope of this application.

It should be understood that the term "and/or" in this specification is only an associative relationship for describing associated objects, indicating that three relationships may exist. For example, A and/or B may indicate three scenarios: A alone; A and B; and B alone. In addition, the character "/" in this specification generally represents an "or" relationship between the associated objects.

It should be also understood that, in the embodiments of this application, sequence numbers of the foregoing processes do not mean execution sequences. The execution sequences of the processes should be determined according to functions and internal logic of the processes, and should not be construed as any limitation on the implementation processes of the embodiments of this application.

A person of ordinary skill in the art may be aware that the units and algorithm steps in the examples described with reference to the embodiments disclosed in this specification can be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, reference may be made to a corresponding process in the foregoing method embodiments, and details are not described again herein.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or may not be performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network elements. Some or all of the units may be selected based on actual requirements to achieve the objectives of the solutions of the embodiments.

In addition, function units in the embodiments of this application may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of the application substantially or parts making contributions to the conventional art or part of the technical solutions may be embodied in form of software product, and the computer software product is stored in a storage medium, including a plurality of instructions configured to enable a computer device (which may be a personal computer, a server, a network device or the like) to execute all or part of the steps of the method in the embodiments of the application. The foregoing storage medium includes any medium that can store program code, such as a USB flash drive, a removable hard disk, a read-only memory (Read-Only Memory, ROM), a random access memory (Random Access Memory, RAM), a magnetic disk, or an optical disc.

Steps of the method in the embodiments of this application may be adjusted in terms of sequence, combined, or deleted based on actual needs.

Modules in the apparatus in the embodiments of this application may be combined, divided, or deleted based on actual needs.

In conclusion, the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A radio frequency conduction test method, wherein the method comprises:
    moving a radio frequency test probe to a first pad of a board so as to allow a test signal on the first pad to be transmitted to the radio frequency test probe for testing, wherein the board comprises a radio frequency front-end circuit, a radio frequency back-end circuit, the first pad, a second pad, and a to-be-welded serial device; the to-be-welded serial device is a device to be welded to the first pad and the second pad; the serial device is one or more components connected in series with another component; and the first pad is connected to the radio frequency front-end circuit, the second pad is connected to the radio frequency back-end circuit, and the radio frequency front-end circuit and the radio frequency back-end circuit are in an off state;
    after moving the radio frequency test probe to the first pad of the board, transmitting the test signal in the radio frequency test probe to a radio frequency test instrument via an impedance conversion apparatus and a directional coupler, wherein
    a straight-through output port of the directional coupler is connected to a first measurement port of the radio frequency test instrument, and a coupling output port of the directional coupler is connected to a second measurement port of the radio frequency test instrument; and
    after completion of the test, moving away the radio frequency test probe and welding the serial device to the first pad and the second pad so as to enable the radio frequency front-end circuit and the radio frequency back-end circuit to be in an on state.

2. The method according to claim 1, wherein the radio frequency test probe and/or the first pad is treated with nickel and gold plating.

3. The method according to claim 2, wherein after the moving a radio frequency test probe to a first pad of a board, the method further comprises: enabling a first portion of the radio frequency test probe to be in contact with a second portion of the first pad, wherein the first portion and/or the second portion is treated with nickel and gold plating.

4. The method according to claim 1, wherein the welding the serial device to the first pad and the second pad comprises:
  welding the serial device to the first pad and the second pad through low-temperature reflow soldering or laser welding.

5. The method according to claim 4, wherein a center-to-center distance between the first pad and the second pad is not less than 0.254 millimeter and not greater than 2.54 millimeters.

6. A radio frequency conduction test system, wherein the system comprises a board, a radio frequency test probe, and a radio frequency test instrument, wherein
  the board comprises a radio frequency circuit, a first pad, and a second pad, wherein the radio frequency circuit comprises a radio frequency front-end circuit and a radio frequency back-end circuit, the first pad is connected to the radio frequency front-end circuit, the second pad is connected to the radio frequency back-end circuit, the radio frequency front-end circuit and the radio frequency back-end circuit are in an off state, and the first pad and the second pad are pads for a serial device to be welded into the radio frequency circuit;
  the radio frequency test probe is configured to transmit a test signal on the first pad to the radio frequency test instrument; and
  the radio frequency test instrument is configured to implement a radio frequency conduction test on the test signal; and
  the system further comprises an impedance conversion apparatus and a directional coupler, wherein the impedance conversion apparatus is connected to the radio frequency test probe and the directional coupler, the directional coupler is further connected to the radio frequency test instrument, the impedance conversion apparatus is configured to transmit the test signal in the radio frequency test probe to the directional coupler, the directional coupler is configured to transmit the test signal to the radio frequency test instrument, a straight-through output port of the directional coupler is connected to a first measurement port of the radio frequency test instrument, and a coupling output port of the directional coupler is connected to a second measurement port of the radio frequency test instrument.

7. The system according to claim 6, wherein the radio frequency test probe and/or the first pad is treated with nickel and gold plating.

8. The system according to claim 7, wherein a center-to-center distance between the first pad and the second pad is not less than 0.254 millimeter and not greater than 2.54 millimeters.

9. A radio frequency conduction test apparatus, wherein the apparatus is in radio frequency conduction testing, and the apparatus comprises a radio frequency circuit, a first pad, and a second pad, wherein the radio frequency circuit comprises a radio frequency front-end circuit and a radio frequency back-end circuit, the first pad is connected to the radio frequency front-end circuit, the second pad is connected to the radio frequency back-end circuit, and the radio frequency front-end circuit and the radio frequency back-end circuit are in an off state; and the first pad and the second pad are pads for a serial device to be welded into the radio frequency circuit; and
  during the radio frequency conduction test, the first pad is configured to transmit a test signal to a radio frequency test probe after the radio frequency test probe is moved to the first pad, wherein the test signal in the radio frequency test probe is transmitted to a radio frequency test instrument via an impedance conversion apparatus and a directional coupler, a straight-through output port of the directional coupler is connected to a first measurement port of the radio frequency test instrument, and a coupling output port of the directional coupler is connected to a second measurement port of the radio frequency test instrument.

10. The apparatus according to claim 9, wherein the first pad is treated with nickel and gold plating.

11. The apparatus according to claim 9, wherein a center-to-center distance between the first pad and the second pad is not less than 0.254 millimeter and not greater than 2.54 millimeters.

* * * * *